(12) United States Patent
Lee et al.

(10) Patent No.: US 8,963,200 B2
(45) Date of Patent: Feb. 24, 2015

(54) METHODS AND APPARATUS FOR INCREASED HOLDING VOLTAGE IN SILICON CONTROLLED RECTIFIERS FOR ESD PROTECTION

(75) Inventors: Jam-Wem Lee, Zhubei (TW); Tzu-Heng Chang, New Taipei (TW); Tsung-Che Tsai, Hsin-Chu (TW); Ming-Hsiang Song, Shin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 142 days.

(21) Appl. No.: 13/527,833

(22) Filed: Jun. 20, 2012

(65) Prior Publication Data

US 2013/0341676 A1  Dec. 26, 2013

(51) Int. Cl.
*H01L 29/45* (2006.01)

(52) U.S. Cl.
USPC ........... 257/147; 257/173; 257/175; 257/355; 257/372; 257/546

(58) Field of Classification Search
CPC . H01L 29/0619; H01L 27/0921; H01L 23/60; H01L 23/62
USPC .......... 257/147, 149, 173, 175, 355, 372, 546
See application file for complete search history.

(56) References Cited

U.S. PATENT DOCUMENTS

| 6,831,334 | B2 * | 12/2004 | Okawa et al. ................. 257/356 |
| 2002/0122280 | A1 * | 9/2002 | Ker et al. ......................... 361/56 |
| 2013/0009204 | A1 * | 1/2013 | Song et al. .................... 257/119 |

* cited by examiner

*Primary Examiner* — Matthew E Warren
(74) *Attorney, Agent, or Firm* — Slater & Matsil, L.L.P.

(57) ABSTRACT

Methods and apparatus for increased holding voltage SCRs. A semiconductor device includes a semiconductor substrate of a first conductivity type; a first well of the first conductivity type; a second well of a second conductivity type adjacent to the first well, an intersection of the first well and the second well forming a p-n junction; a first diffused region of the first conductivity type formed at the first well and coupled to a ground terminal; a first diffused region of the second conductivity type formed at the first well; a second diffused region of the first conductivity type formed at the second well and coupled to a pad terminal; a second diffused region of the second conductivity type formed in the second well; and a Schottky junction formed adjacent to the first diffused region of the second conductivity type coupled to a ground terminal. Methods for forming devices are disclosed.

19 Claims, 3 Drawing Sheets

METHODS AND APPARATUS FOR INCREASED HOLDING VOLTAGE IN SILICON CONTROLLED RECTIFIERS FOR ESD PROTECTION

BACKGROUND

Electrostatic discharge ("ESD") protection structures are needed for integrated circuits. In ESD protection, an ESD circuit is formed near integrated circuit terminals such as input and output pads, and also for power supply terminals. The ESD protection circuit provides a path to bypass current from the terminal to a ground or from the terminal to a power supply rail, so that the current bypasses the internal circuitry. Voltages far in excess of the operating voltages, in both positive and negative magnitudes, are observed during electrostatic discharges. The ESD protection structure prevents the voltages and corresponding current from destroying sensitive components in an integrated circuit. Advances are needed in ESD structures to prevent damage to the increasingly sensitive and ever smaller devices currently going into production and for future devices. To provide adequate protection, the ESD structures need to have low on-resistance, fast turn on speed, and be arranged to be reliably produced in the advanced semiconductor processes currently in use, without requiring significant silicon area.

Silicon controlled rectifiers ("SCRs"), which may be conveniently formed by forming parasitic transistors in doped well regions adjacent a terminal, are often used for ESD structures. Because an SCR can be designed to "trigger" on in response to a trigger voltage over a threshold, and then to safely conduct ESD stress current through an alternative path to an external terminal and thus protect the internal circuitry coupled to a pad terminal, the SCR provides many features that are desirable for ESD protection. However, the existing SCR structures also have some characteristics that are undesirable. Existing SCR circuits are subject to a "latch up" phenomenon. In latch up, the SCR may remain active following an ESD event. This condition may persist until the power to the integrated circuit is cycled, preventing the internal circuitry coupled to the terminal from operating properly. Latch up immunity is a requirement for SCR circuitry that some SCR structures implemented in the existing approaches do not provide. After the SCR circuit is triggered, it may remain active as long as a voltage over the "holding voltage" is present. If the "holding voltage" for an ESD SCR is too low, then, the SCR will likely latch up and stay active when the pad is no longer under ESD stress. Accordingly increased holding voltages in SCRs for ESD protection are desirable.

However, existing approaches to increasing the holding voltage often require additional devices, and may increase semiconductor area. Semiconductor area is a critical characteristic as integrated circuit devices continue to add additional functionality and become increasingly more highly integrated.

Improved SCR structures that are semiconductor area efficient, have excellent ESD performance including lowered holding voltages and turn on speed, have improved latch-up immunity, and which are compatible with current and future advanced semiconductor processes are therefore needed.

BRIEF DESCRIPTION OF THE DRAWINGS

For a more complete understanding of the illustrative embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the illustrative embodiments and are not necessarily drawn to scale.

DETAILED DESCRIPTION

The making and using of illustrative example embodiments are discussed in detail below. It should be appreciated, however, that an illustrative embodiment provides many applicable inventive concepts that can be embodied in a wide variety of specific contexts. The embodiments herein are illustrative examples but do not limit the scope of the disclosure, and do not limit the scope of the appended claims.

In the embodiments, SCR structures are formed using approaches that include providing N+ and P+ regions in wells to form, in one example configuration, a p-n-p-n current path in an SCR structure between the pad under protection and a voltage supply, which bypasses the internal circuit coupled to the pad. Because the SCR in this configuration acts as a forward biased current path, it is said to have an anode, and a cathode. The anode of the SCR structure is coupled to the pad, while the cathode of the SCR structure is coupled to the voltage terminal. An additional source of hole current is created near the cathode region of the SCR. By adding hole current during active operation, the holding voltage is increased, so that latch up immunity is improved. In the example embodiments, a metal to semiconductor Schottky junction is formed on the semiconductor substrate, adjacent the cathode of the SCR. The Schottky junction is coupled to the voltage supply terminal and provides additional carriers into the substrate near the SCR cathode, thus increasing the holding voltage needed to keep the SCR active following a trigger event that turns on the SCR structure.

Figure 1:
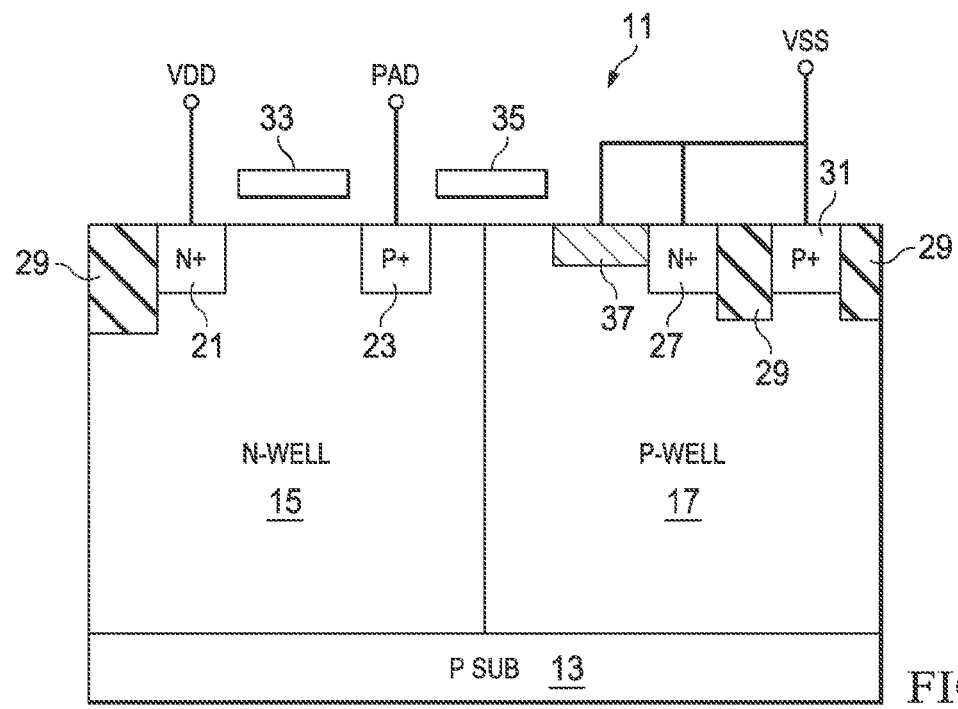
FIG. 1 depicts in a cross-sectional view an illustrative embodiment.

FIG. 1 depicts in a cross sectional view an example embodiment of a SCR structure 11. In FIG. 1, a portion of a semiconductor substrate 13 is depicted. Semiconductor substrate 13 may be an N-type or P-type doped substrate, and may be formed from silicon, gallium arsenide, or other known semiconductor materials used in semiconductor device processing. Although in the illustrated examples presented herein for explanation a semiconductor substrate is used, in other alternative embodiments epitaxially grown semiconductor materials may be used, or, silicon on insulator (SOI) layer may be used, as the substrate 13. While the semiconductor substrate 13 may be doped with either N-type or P-type impurities, in the examples presented herein the substrate 13 is a P-type substrate.

Dopant impurities are implanted into the semiconductor material to form P+, and, P–type regions in semiconductor material, and N+ and N–type regions, as is well known. Dopant atoms for P-type regions include boron, for example. In N-type regions, dopant atoms include phosphorous, arsenic, and antimony, for example. Doping may be done by ion implantation processes. When coupled with photolithographic processes, doping may be performed in selected areas by implanting atoms into exposed regions while other areas are masked. Also, thermal drive or anneal cycles may be used to use thermal diffusion to expand or extend a previously doped region. As alternatives, some epitaxial deposition of semiconductor materials allow for in-situ doping during the epitaxial processes. Implantation can be done through certain materials, such as thin oxide layers, as is known. Concentrations following doping may range from $1E16/cm^3$ to $1E22/cm^3$, with P+ and N+ concentrations being greater than about $1E18/cm^3$, for example.

A first N-type doped well region 15 is formed within the semiconductor substrate 13. A second doped well region 17 is formed in the semiconductor substrate 13 and doped to a P-type. The well region 17 is formed proximate to and adjacent to the well region 19 and the common boundary of the well regions 17 and 15 in FIG. 1 thus forms a p-n junction.

The well regions may be formed using two different dopants implanted into substrate 13. Alternatively a doped substrate, such as a P type substrate, may be doped only to form an N-well, with the remainder of the substrate 13 acting as the P-well.

Semiconductor manufacturing processes that may be used to form the structure 11 include photolithography, wet and dry etching, plasma etching, ashing, chemical vapor deposition, plasma vapor deposition, plasma enhanced chemical vapor deposition, electroless plating and electroplating, silicidation, oxide deposition including thermal oxidation, TEOS, spun on glass and other oxide and nitride depositions, planarization processes such as CMP, forming isolation regions using trenches or local oxidation of silicon (LOCOS) and the like. SCR ESD structures that have P and N wells, and example processes for forming them, are described in patent application U.S. Ser. No. 13/176,780, entitled "Bidirectional Dual-SCR Circuit for ESD Protection", filed Jul. 6, 2011, which is hereby incorporated herein by reference in its entirety.

A P+ doped region 23 is formed at the surface of the substrate 13 and forms an anode contact for the SCR structure 11. The P+ region is disposed in the P-well region 15 and is coupled to a PAD terminal. The PAD terminal is, in an example application, an input, output or input/output terminal of an integrated circuit formed on the semiconductor substrate 13. An N+ doped region 21 is provided in the N-well region 15 at the surface of substrate 13 and forms a VDD contact for the N-well 15. In FIG. 1 a VDD supply is coupled to region 21.

An N+ doped region 27 is formed in P-well 17 and is electrically coupled to ground or VSS, region 27 is the cathode for the SCR structure 11. A P+ region 31 is formed in the P-well 17 at the surface of the substrate 13 and forms a VSS contact for the P-well 17. As shown in FIG. 1 this is electrically coupled to a VSS supply or ground terminal, as is the N+ region 27. Polysilicon regions 33 and 35 are formed over the substrate between N+ and P+ regions, as is typically done in a MOS semiconductor process, and these polysilicon gates 33 and 35 are electrically floating. Isolation regions 29 are formed, for example, using shallow trench isolation (STI) structures that are etched and filled with a dielectric material. STI regions 29 provide electrical isolation where needed. LOCOS or other isolation forms may be used and these examples form additional alternative embodiments.

In the example SCR embodiment 11 of FIG. 1, a metal to semiconductor Schottky junction 37 is formed. This is a metal formed directly on the substrate and may be formed of nickel (Ni), for example, or another material such as cobalt (Co), or titanium (Ti). The Schottky junction is formed using metals having certain work functions so that the metal to semiconductor junction acts as a Schottky diode; not just as an ohmic contact. The Schottky junction 37 is coupled to VSS and during operation, it provides additional hole current into the P-well 17 adjacent the SCR cathode 27. As is explained below, the added hole current provides a higher holding voltage after the SCR structure 11 becomes active, such as during a positive ESD stress event. The Schottky junction 27 may be formed by metal sputtering, plating, electroplating, electroless plating, or by various metal deposition methods including PVD, CVD. The thickness of the Schottky junction 37 is in the range of less than 100 nanometers, and more likely, less than 50 nanometers and as little as 10 nanometers in thickness, depending on the semiconductor process and circuit design. The Schottky junction 37 may have a resistance as low as 1 ohm/square, depending on the process used.

Figure 2:
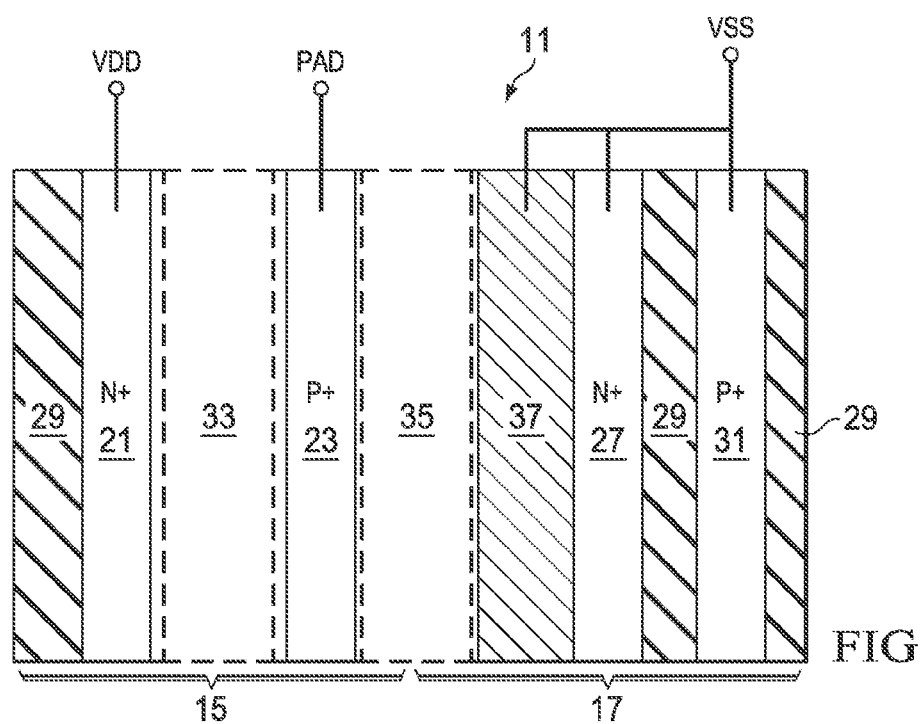
FIG. 2 depicts in a plan view the embodiment of FIG. 1.

FIG. 2 depicts an example plan view of the SCR structure 11 of FIG. 1. In FIG. 2 the gate layers 33 and 35 are shown dashed for clarity Like numerals from FIG. 1 are used for like elements in FIG. 2. In the plan view of FIG. 2, in this illustrative non-limiting example, the N+, P+ doped regions 21, 23, 27, 31, and the Schottky junction 37, are formed as parallel "stripes" overlying the P-well 17 and the N-well 15. While the striped arrangement for the layout as shown in the plan view of FIG. 2 provides one possible implementation that forms an embodiment, the Schottky junction 37 and the other N+ and P+ regions could be formed as a series of squares, or rectangles, each coupled to the corresponding terminal or voltage. The shape and arrangement of the various elements of the SCR structure 11 can vary so long as the hole current injected by the Schottky junction is present proximate to the cathode 27. These variations form additional alternative embodiments.

Figure 3:
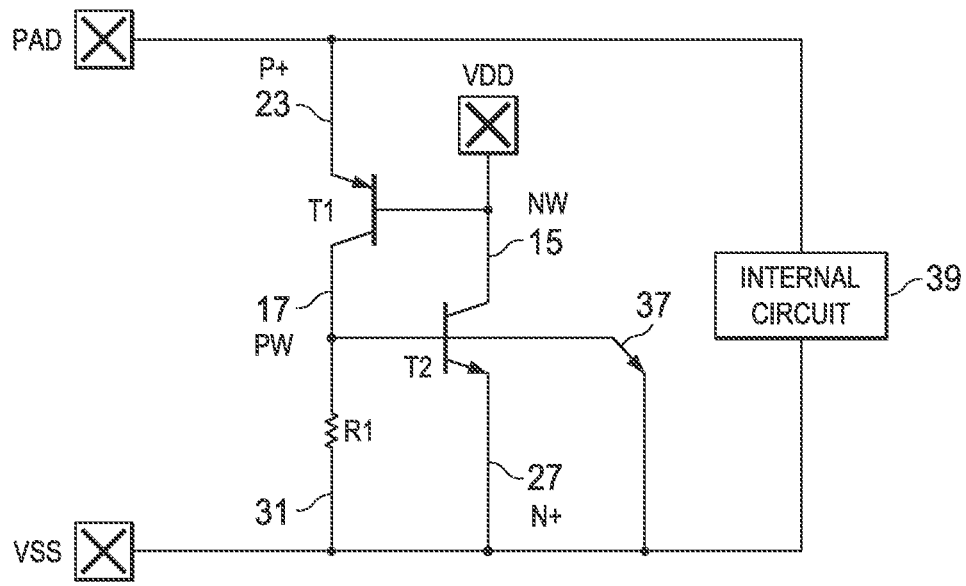
FIG. 3 depicts in a circuit diagram an embodiment.

In FIG. 3, a circuit diagram is illustrated in a schematic view. Reference numerals indicate the corresponding structural elements from FIG. 1, for better explanation of the embodiments. In FIG. 3, an input, output or input/output terminal to be protected from an ESD stress is labeled PAD. An internal circuit 39, which may be any integrated circuit function that is implemented on the semiconductor substrate 13, is shown coupled to the PAD terminal and to a VSS supply terminal. The SCR structure 11 is shown in schematic form coupled between the PAD terminal and the VSS supply. In FIG. 3, a parasitic PNP transistor T1 is shown with an emitter formed by the P+ region 23, (see FIG. 1), and a base formed by the N-well 15, (see FIG. 1). The collector of T1 is formed by the P-well 17, which is coupled to the VSS pad by the resistor R11 which is also a parasitic component (intrinsic resistance) of the P-well 17 and the P+ terminal 31.

A second transistor T2, an NPN transistor, is also formed from parasitic elements. The collector of T2 is formed by the N-well 15, which is the same element as the base of the PNP transistor T1. The transistor T2 has its base formed by the P-well 17, and its emitter is the N+ region 27 which is coupled to the VSS pad. In addition, the Schottky junction 37 forms another NPN emitter region, labeled 37 in the circuit diagram.

In operation the SCR structure 11 will turn on in response to a "trigger" voltage Vt at the PAD terminal. As can be understood by examining the circuit as depicted in FIG. 3, when the voltage at the PAD is high enough, and higher than VDD by some predetermined margin, the PNP transistor T1, which has VDD at its base, will turn on. Current will flow from the emitter of T1, (P+ region 23), into the collector of T1 (P-well 17) and that region is also the base of the transistor T2. As the current flows through the intrinsic resistor R11, another parasitic element, the transistor T2 will also turn on as the base voltage increases, and current will flow from the collector of T2 (N-well 15), into the emitters of T2 labeled 27 and 37 (the N+ cathode 27 and the Schottky junction 37 in FIG. 1). Thus after a trigger voltage Vt or higher occurs at the PAD terminal, the SCR structure 11 forms an ESD protection bypass path that takes current from the PAD terminal into the VSS terminal, protecting the internal circuit 39 from the ESD positive stress event.

Once the SCR structure 11 becomes active, the SCR 11 will stay on until the voltage at the PAD is below a holding voltage, Vh. In the embodiments of FIGS. 1-3, the holding voltage is increased due to the hole injection function of the Schottky junction 37 into the substrate next to the cathode 27. The additional hole current path generated by Schottky junction 37 will be close to the surface. That added hole current will push the SCR current path deeper and the SCR current path will be longer than the current path in an existing approach cell without the Schottky junction. The holding voltage will be increased by this longer SCR current path. While current is flowing, the holes injected near the cathode 27 will act to increase the holding voltage substantially over the existing SCR approaches.

ESD protection for pad terminals may provide protection from more than one mode of ESD stress. In FIG. 3, the circuit illustrated is arranged to protect from a positive strike from the PAD terminal with respect to VSS, which is referred to as a "PS" mode. Another ESD strike mode where SCR circuits may be used to protect internal circuitry is an "ND" mode, or a negative ESD stress at the PAD terminal with respect to VDD. In this case, the embodiment of FIG. 1 may be used, but is varied and is connected so that the PAD and VSS terminals are rearranged to create a current path of n-p-n-p from the PAD to VDD. In such an alternative embodiment, the Schottky junction device would again be formed adjacent the doped diffusion that acts as the SCR cathode, which would be a P+ diffusion in the N-well, to inject current as needed to increase the holding voltage. These modifications create additional alternative embodiments. More than one SCR structure may be used at an input output terminal, for example, a PS mode SCR structure and a ND mode SCR structure may both be formed at a PAD terminal to provide protection from both stress modes. The embodiment SCR structures herein may be used for protection from both stress modes.

Figure 4:
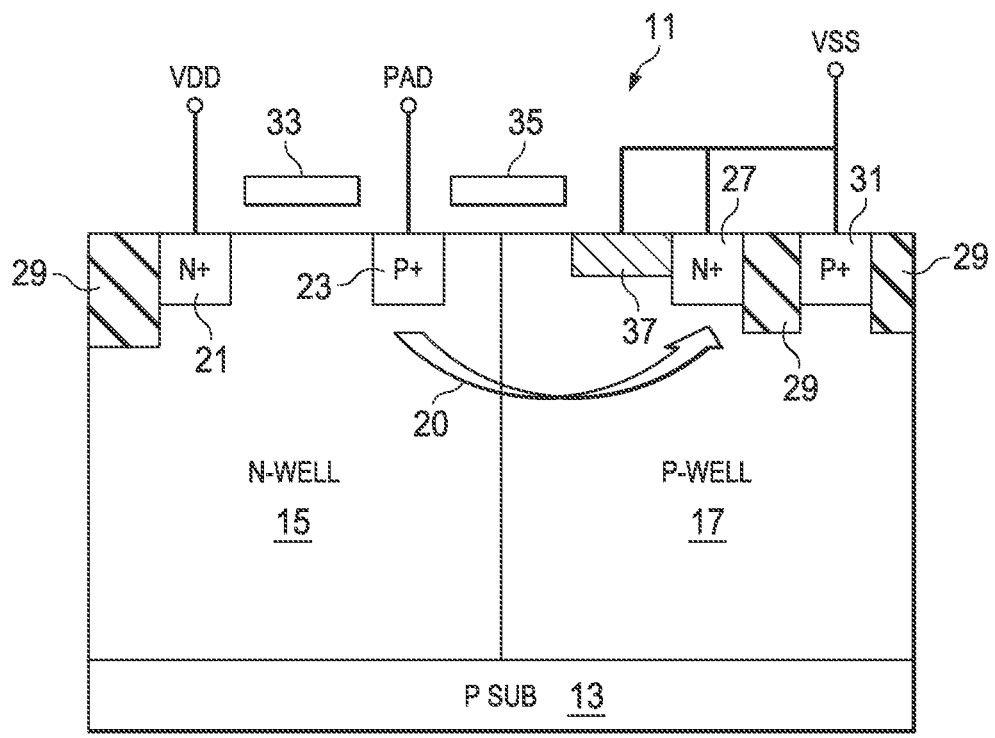
FIG. 4 depicts in a cross sectional view a current path of the illustrative embodiment of FIG. 1.

FIG. 4 illustrates the current path for the embodiment SCR structure 11 of FIG. 1. FIG. 4 repeats FIG. 1, and so no additional explanation is provided, except that the arrow 20 depicts the flow of current during a positive ESD stress over the trigger voltage Vt. In FIG. 4, the ESD current flows form the P+ anode 23, into the N-well 15, across the p-n junction between the P and N-well regions 15 and 17, and into the cathode 27. Thus the SCR current path is the typical p-n-p-n current path used in SCR ESD circuits, however by using the embodiments of this disclosure, additional hole current is provided adjacent or proximal to the cathode 27 by the addition of the Schottky junction 37, which is coupled to VSS and is formed at the surface of the substrate in P-well 17 and between the p-n junction of the N-well 15 and the P-well 17, and the cathode N+ region 27.

Using the embodiments including the Schottky junction in the SCR as described above, several advantages may be attained. The larger holding voltage obtained can prevent latch up risk (provides greater latch up immunity). The SCR structure 11 provides the enhanced latch up immunity without significant area increase and with only minor changes in ESD performance. The addition of the Schottky junction adjacent the cathode is easily implemented without requiring design changes to the rest of the SCR structure, and is therefore low cost.

Figure 5:
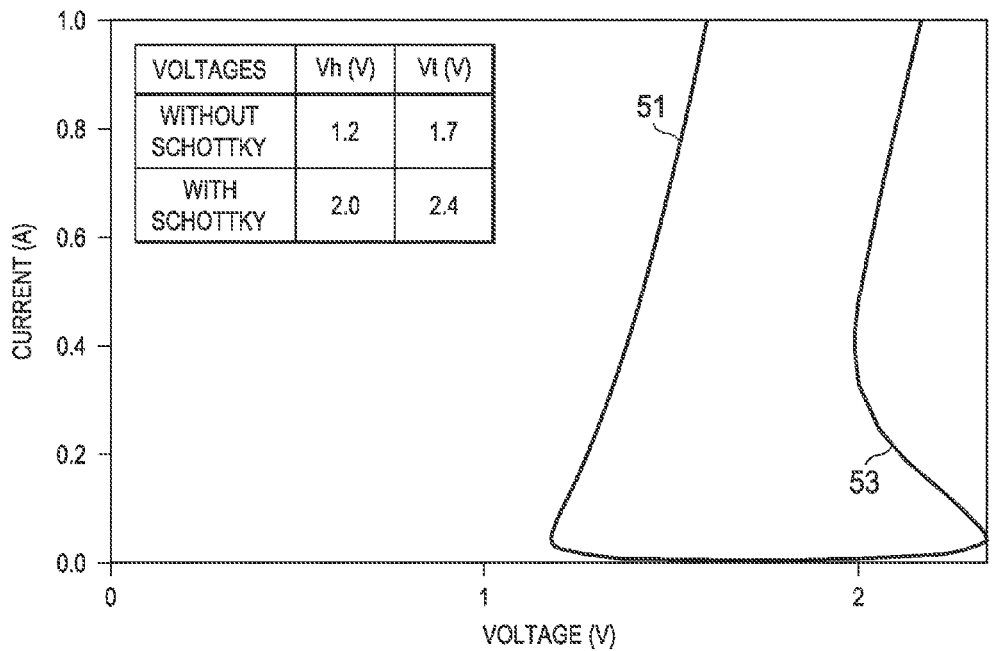
FIG. 5 depicts in an I-V plot diagram the current-voltage characteristics for the embodiments and a comparative example.

FIG. 5 depicts in a table and I-V plot a comparison between the embodiment of FIG. 1 and an existing approach. In FIG. 5, as shown in the table, the SCR without the Schottky junction (labeled "w/o Schottky") has a holding voltage Vh of only 1.2 Volts. The trigger voltage Vt is also only 1.7 Volts. In contrast, by use of the embodiment structure as shown in FIG. 1, in an embodiment with the Schottky junction (labeled "w/i Schottky") the holding voltage Vh is increased to 2 Volts, and the trigger voltage Vt is increased to 2.4 Volts, using structures formed in the same semiconductor process, and having similar areas.

In FIG. 5, a comparison is also illustrated for the I-V curves of the embodiment (trace 53) and a comparative example for existing SCR structures (trace 51). As shown, the trigger voltage Vt along the X-axis in the I-V plot for the embodiments is about 2.4 Volts, the point where significant current begins to conduct, while for the existing approach SCR, it is about 1.7 Volts. The holding voltage Vh that is exhibited as current flows through the SCR is about 2 Volts for the embodiments, while the existing SCR structure formed in the same semiconductor process with the same sized elements is only 1.2 Volts. The lower voltage 1.2 Volts is close to operating voltages (around 1 Volt) and thus illustrates the risk of a "latch up" problem after an ESD event. The embodiments require a much higher holding voltage to stay "on"—and latch up problems are thereby either eliminated or greatly reduced using the embodiments.

Figure 6:
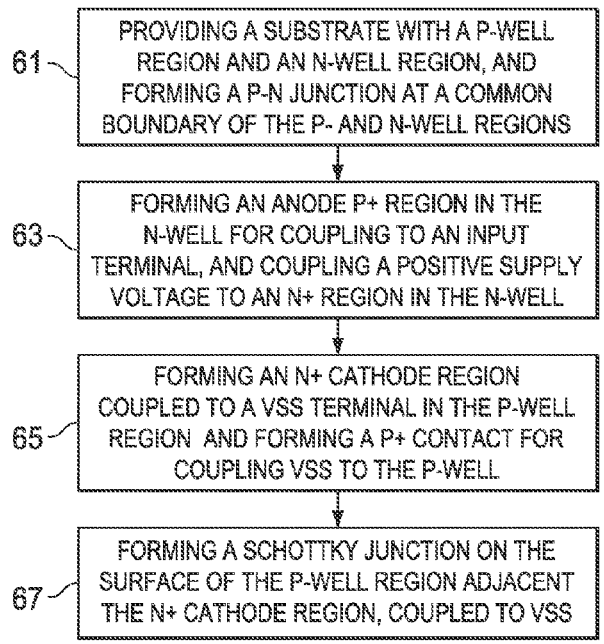
FIG. 6 depicts a flow diagram an embodiment method.

FIG. 6 depicts in a simple flow diagram a method embodiment for forming the SCR structures. In FIG. 6 at stage 61, a substrate is provided with a P-well region and an N-well region forming a p-n junction at a common boundary of the two well regions. At stage 63, an anode region is formed in the N-well region, and a positive supply voltage is coupled to the N-well by an N+ region. In stage 65, an N+ cathode region is coupled to a VSS terminal in the P-well region and the P-well is coupled to VSS (or ground). At stage 67, the Schottky junction is formed on the surface of the P-well region adjacent the N+ cathode region and coupled to VSS.

Note that the conductivity types of the various regions, and the voltages the regions are coupled to, are described above with respect to the non-limiting embodiment of a PS stress mode protection provided by the example circuit in FIG. 3. As is known to those skilled in the art, the p-n-p-n path described above for a PS ESD stress mode at a pad may also be varied. For example to provide protection for an ND stress mode at the pad, an SCR may be coupled using an n-p-n-p path by simply changing the configuration of the terminals connected to the structure in FIGS. 1 and 2. These alternative arrangements are contemplated as an additional alternative embodiment and fall within the scope of the appended claims; likewise other obvious variations in the configurations and structures are also contemplated as alternative embodiments. In an alternative embodiment, several types of SCR protection may be provided at a single pad using SCR structures including the embodiments described above.

In an example embodiment, a semiconductor device includes a semiconductor substrate of a first conductivity type; a first well of the first conductivity type formed into the semiconductor substrate; a second well of a second conductivity type formed into the semiconductor substrate adjacent to the first well, an intersection of the first well and the second well forming a p-n junction; a first diffused region of the first conductivity type formed at an upper surface of the first well and coupled to a ground terminal; a first diffused region of the second conductivity type formed at the upper surface of the first well and coupled to the ground terminal; a second diffused region of the first conductivity type formed at the upper surface of the second well and coupled to a pad terminal; a second diffused region of the second conductivity type formed at the upper surface of the second well and coupled to a positive supply terminal; and a Schottky junction formed at the surface of the first well adjacent to the first diffused region of the second conductivity type and coupled to the ground terminal. In a further embodiment of the above described semiconductor device, the Schottky junction further includes a metal contacting the surface of the semiconductor substrate in the first well. In yet another embodiment of the semiconductor device, the metal is one selected from the group consisting essentially of titanium, nickel, and cobalt. In still another embodiment of the above described semiconductor device, the first conductivity type is a p-type. In a further embodiment of a semiconductor device, the second conductivity type is an n-type. In still another embodiment of a semiconductor device, the device forms a silicon controlled rectifier (SCR) coupled between the pad and the ground terminal. In still another embodiment of the above described semiconductor device, the first diffusion of the first conductivity type in the second well forms an anode for the SCR. In a further alternative embodiment of the above described semiconductor device, the diffusion of the second conductivity type in the first well forms a cathode for the SCR. In still another embodiment, the Schottky junction further includes a continuous stripe over the surface of the semiconductor substrate in the first well region. In yet another alternative embodiment of the above described semiconductor device the Schottky junction further includes a plurality of metal shapes formed over the upper surface of the first well region, and coupled in parallel.

In another embodiment, an ESD protection structure for an integrated circuit is provided, and includes: an internal circuit formed on a semiconductor substrate of a first conductivity type and having an input coupled to a pad terminal; a first well of the first conductivity type formed into the semiconductor substrate; a second well of a second conductivity type formed into the semiconductor substrate adjacent to the first well, an intersection of the first and second wells forming a p-n junction in the semiconductor substrate; a first diffused region of the first conductivity type formed at an upper surface of the first well and coupled to a ground terminal; a first diffused region of the second conductivity type formed at the upper surface of the first well and coupled to the ground terminal; a second diffused region of the first conductivity type formed at the upper surface of the second well and coupled to a pad terminal; a second diffused region of the second conductivity type formed at the upper surface of the second well and coupled to a positive supply terminal; and a Schottky junction formed at the surface of the first well adjacent to the first diffused region of the second conductivity type and coupled to the ground terminal.

In a further alternative embodiment, the ESD protection structure further includes the Schottky junction disposed between the p-n junction at an upper surface of the semiconductor substrate, and an edge of the first diffused region of the second conductivity type in the first well. In still another embodiment, the above described ESD protection structure further includes: a Schottky junction that forms a striped, continuous metal in physical contact with an upper surface of the semiconductor substrate in the first well region. In yet another embodiment, the Schottky junction comprises a series of metal shapes formed in physical contact with an upper surface of the semiconductor substrate in the first well region. In still another embodiment, in the ESD structure described above the first conductivity type is a p-type. In yet another embodiment, in the ESD protection structure described above the second conductivity type is an n-type.

In a further embodiment, a method is provided which includes forming in a semiconductor substrate of a first conductivity type a first well region of the first conductivity type; forming in the semiconductor substrate a second well region of a second conductivity type, the second well region disposed adjacent to the first well region and forming a p-n junction at a boundary between the first and second well regions; forming a first doped region of the first conductivity type in the first well region, coupled to a ground terminal; forming a first doped region of the second conductivity type in the first well region, coupled to the ground terminal; forming a second doped region of the first conductivity type in the second well region, coupled to a pad terminal; forming a second doped region of the second conductivity type in the second well region, coupled to a positive supply terminal; forming a Schottky junction on an upper surface of the semiconductor substrate in the first well region, proximate to the first doped region of the second conductivity type; and in response to a voltage over a threshold at the pad terminal, conducting current through a current path in a silicon controlled rectifier formed by the second doped region of the first conductivity type in the second well region, the second well region, the first well region, and the first doped region of the second conductivity type in the first well region, and injecting current through the Schottky junction into the first well region.

In still another embodiment, the above described method continues and includes wherein forming a Schottky junction further comprises forming a metal to semiconductor junction. In yet another embodiment, the above described method includes forming the metal to semiconductor junction further including forming a metal selected from the group consisting essentially of cobalt, titanium and nickel. In still another embodiment, in the above described methods the current path transitions through a material of the first conductivity type, the second conductivity type, the first conductivity type, and the second conductivity type between the pad terminal and the ground terminal.

Although the illustrative embodiment and its advantages have been described in detail, it should be understood that various changes, substitutions, and alterations can be made herein without departing from the spirit and scope of the invention as defined by the appended claims. For example, alternate materials, implant doses and temperatures may be implemented.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. A semiconductor device comprising:
a semiconductor substrate of a first conductivity type;
a first well of the first conductivity type formed into the semiconductor substrate;

a second well of a second conductivity type formed into the semiconductor substrate adjacent to the first well, an intersection of the first well and the second well forming a p-n junction;

a first diffused region of the first conductivity type formed at an upper surface of the first well and coupled to a ground terminal;

a first diffused region of the second conductivity type formed at the upper surface of the first well and coupled to the ground terminal;

a second diffused region of the first conductivity type formed at the upper surface of the second well and coupled to a pad terminal;

a second diffused region of the second conductivity type formed at the upper surface of the second well and coupled to a positive supply terminal; and a Schottky junction formed at the surface of the first well adjacent to the first diffused region of the second conductivity type and coupled to the ground terminal, wherein the Schottky junction is laterally displaced from the first diffused region of the second conductivity type along the plane of the upper surface of the first well.

2. The semiconductor device of claim 1, wherein the Schottky junction further comprises a metal contacting the surface of the semiconductor substrate in the first well.

3. The semiconductor device of claim 2, wherein the metal is one selected from the group consisting essentially of titanium, nickel, and cobalt.

4. The semiconductor device of claim 1, wherein the first conductivity type is a p-type.

5. The semiconductor device of claim 1, wherein the second conductivity type is an n-type.

6. The semiconductor device of claim 1, wherein the device forms a silicon controlled rectifier (SCR) coupled between the pad and the ground terminal.

7. The semiconductor device of claim 6, wherein the first diffusion of the first conductivity type in the second well forms an anode for the SCR.

8. The semiconductor device of claim 6, wherein the diffusion of the second conductivity type in the first well forms a cathode for the SCR.

9. The semiconductor device of claim 1, wherein the Schottky junction further comprises a continuous stripe over the surface of the semiconductor substrate in the first well region.

10. The semiconductor device of claim 1, wherein the Schottky junction further comprises a plurality of metal shapes formed over the upper surface of the first well region, and coupled in parallel.

11. An ESD protection structure for an integrated circuit, comprising:

an internal circuit formed on a semiconductor substrate of a first conductivity type and having an input coupled to a pad terminal;

a first well of the first conductivity type formed into the semiconductor substrate;

a second well of a second conductivity type formed into the semiconductor substrate adjacent to the first well, an intersection of the first and second wells forming a p-n junction in the semiconductor substrate;

a first diffused region of the first conductivity type formed at an upper surface of the first well and coupled to a ground terminal;

a first diffused region of the second conductivity type formed at the upper surface of the first well and coupled to the ground terminal;

a second diffused region of the first conductivity type formed at the upper surface of the second well and coupled to a pad terminal;

a second diffused region of the second conductivity type formed at the upper surface of the second well and coupled to a positive supply terminal; and a Schottky junction formed at the surface of the first well adjacent to the first diffused region of the second conductivity type and coupled to the ground terminal, wherein the Schottky junction is disposed between the p-n junction at an upper surface of the semiconductor substrate, and an edge of the first diffused region of the second conductivity type in the first well.

12. The ESD protection structure of claim 11, wherein the Schottky junction forms a striped, continuous metal in physical contact with an upper surface of the semiconductor substrate in the first well region.

13. The ESD protection structure of claim 11, wherein the Schottky junction comprises a series of metal shapes formed in physical contact with an upper surface of the semiconductor substrate in the first well region.

14. The ESD protection structure of claim 11, wherein the first conductivity type is a p-type.

15. The ESD protection structure of claim 11, wherein the second conductivity type is an n-type.

16. A method, comprising:

forming in a semiconductor substrate of a first conductivity type a first well region of the first conductivity type;

forming in the semiconductor substrate a second well region of a second conductivity type, the second well region disposed adjacent to the first well region and forming a p-n junction at a boundary between the first and second well regions;

forming a first doped region of the first conductivity type in the first well region, coupled to a ground terminal;

forming a first doped region of the second conductivity type in the first well region, coupled to the ground terminal;

forming a second doped region of the first conductivity type in the second well region, coupled to a pad terminal;

forming a second doped region of the second conductivity type in the second well region, coupled to a positive supply terminal;

forming a Schottky junction on an upper surface of the semiconductor substrate in the first well region, proximate to the first doped region of the second conductivity type and between the p-n junction and an edge of the first doped region of the second conductivity type in the first well; and in response to a voltage over a threshold at the pad terminal, conducting current through a current path in a silicon controlled rectifier formed by the second doped region of the first conductivity type in the second well region, the second well region, the first well region, and the first doped region of the second conductivity type in the first well region, and injecting current through the Schottky junction into the first well region.

17. The method of claim 16, wherein forming a Schottky junction further comprises forming a metal to semiconductor junction.

18. The method of claim 17, wherein forming the metal to semiconductor junction further comprises forming a metal selected from the group consisting essentially of cobalt, titanium and nickel.

19. The method of claim 16, wherein the current path transitions through a material of the first conductivity type, the second conductivity type, the first conductivity type, and the second conductivity type between the pad terminal and the ground terminal.

* * * * *